US005150067A

United States Patent [19]

McMillan

[11] Patent Number: 5,150,067

[45] Date of Patent: Sep. 22, 1992

[54] ELECTROMAGNETIC PULSE GENERATOR USING AN ELECTRON BEAM PRODUCED WITH AN ELECTRON MULTIPLIER

[76] Inventor: Michael R. McMillan, 19151 Stedwick Dr., Gaithersburg, Md. 20879-2937

[21] Appl. No.: 516,143

[22] Filed: Apr. 16, 1990

[51] Int. Cl.[5] ........................ H03K 3/04; H01J 43/06

[52] U.S. Cl. .................................... 328/64; 315/5.11; 315/5.12; 315/5.33; 315/5.51; 315/39; 330/42; 313/103 CM; 313/399

[58] Field of Search ..................... 315/3, 5, 5.11, 5.12, 315/5.29, 5.33, 5.36, 5.37, 5.39, 5.51, 39; 330/42, 44; 328/64, 65; 313/103 CM, 105 CM, 534, 399, 379, 387; 250/207

[56] References Cited

U.S. PATENT DOCUMENTS

| | | | |
|---|---|---|---|
| 2,416,302 | 2/1947 | Goodall | 315/5.11 X |
| 2,416,303 | 2/1947 | Parker | 315/5.11 |
| 2,564,277 | 8/1951 | Rabinovitch | 315/5.11 |
| 2,645,739 | 7/1953 | Fremlin | 315/5.11 |
| 2,698,398 | 12/1954 | Ginzton | 315/5.29 |
| 2,785,339 | 3/1957 | Goddard | 333/112 X |
| 2,917,656 | 12/1959 | Waters | 315/5 |
| 3,107,313 | 10/1963 | Hechtel | 315/5.29 X |
| 3,309,557 | 3/1967 | Crowley-Milling | 315/5 |
| 3,360,678 | 12/1967 | Kerns | 315/3 |
| 3,649,868 | 3/1972 | Bensusson | 315/5.11 X |
| 3,659,203 | 4/1972 | Ross | 375/35 |
| 3,757,157 | 9/1973 | Enck, Jr. et al. | 315/39 |
| 3,854,066 | 12/1974 | Payne | 330/42 X |
| 4,086,487 | 4/1978 | Johnson | 330/42 X |
| 4,313,072 | 1/1982 | Wilson | 315/5 |
| 4,329,686 | 5/1982 | Mourou | 333/258 X |
| 4,631,447 | 12/1986 | Friedman | 315/5 |
| 4,810,926 | 3/1989 | Schwarz et al. | 313/346 R |
| 4,853,595 | 8/1989 | Alfano | 313/532 |

OTHER PUBLICATIONS

Bateman, J. E. et al., "A New Photomultiplier Tube Utilising Channel Plate Electron Multipliers as the gain producing elements", *Nuclear Instruments & Methods,* vol. 137, No. 1, Aug. 1976, pp. 61-70.

C. B. Norris, "Travelling-wave electron-beam-semiconductor system for picosecond resetime pulse generation," J. Appl. Phys. 46, 1966 (1975).

L. P. Hocker et al., "Characterization of Microchannel Plate Photomultipliers for Plasma Diagnostics," IEEE Trans. Nad. Sci. 26, 356 (1979).

E. H. Eberhardt, "An Operational Model for Microchannel Plate Devices," IEEE Trans. Nucl. Sci. 28, 712 (1981).

F. C. DeLucia et al., "Microwave Generation from Picosecond Demodulation Sources," Appl. Phys. lett. 47, 894 (1985).

W. M. Cook and D. G. Stearns, "Fabrication Techniques Used in the Construction of a High Resolution X-ray Framing Camera," UCID-21225 (1987).

H. M. Bizek et al., "Gigatron," IEEE Trans. Plasma Sci. 16, 258 (1988).

K. Oba et al., "MCP-PMTs as Ultra-fast Wide-band and Infrared-sensitive Detectors," Adv. Electronics Electron Phys. 74, 87 (1988).

D. G. Stearns et al., "X-ray Framing Camera for Picosecond Imaging of Laser-produced Plasmas," Rev. Sci. Instrum. 60, 363 (1989).

C. Murray et al., "Electron Beam Generation by Electron Multiplication," Appl. Phys. Lett. 54, 2303 (1989).

*Primary Examiner*—Eugene R. LaRoche
*Assistant Examiner*—Benny T. Lee

[57] ABSTRACT

A pulse generator for producing high-energy, subnanosecond electromagnetic pulses. The generator comprises a pulsed cathode assembly (160) which includes a microchannel-plate electron multiplier (150) triggered by a low-intensity, pulsed electron beam. An intense, pulsed electron beam obtained from the cathode assembly is directed through aperture (71) in waveguiding structure (170). It generates electromagnetic pulses, which are carried by the waveguiding structure to load (130).

12 Claims, 5 Drawing Sheets

Fig. 11
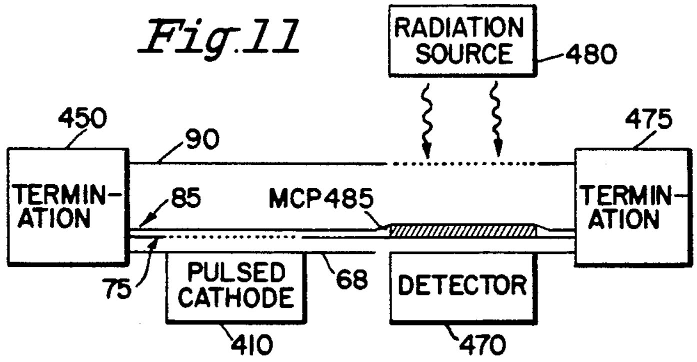
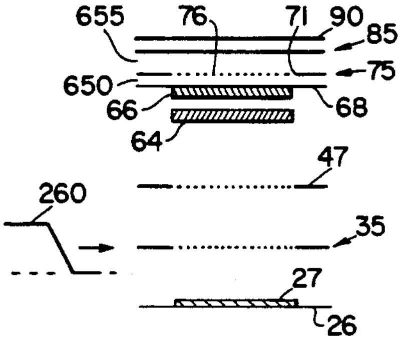
Fig. 12a
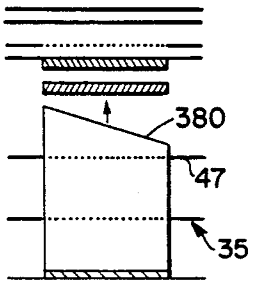
Fig. 12b
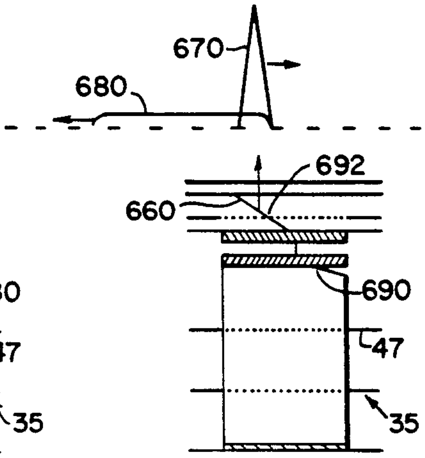
Fig. 12c
Fig. 13
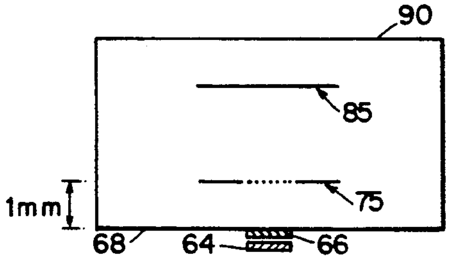
Fig. 14
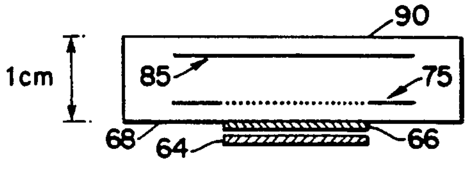

ELECTROMAGNETIC PULSE GENERATOR USING AN ELECTRON BEAM PRODUCED WITH AN ELECTRON MULTIPLIER

BACKGROUND OF THE INVENTION

This invention relates to the field of high-energy, short-pulse generators, particularly to generators using pulsed electron beams to produce subnanosecond pulses of electromagnetic radiation.

High energy, subnanosecond electromagnetic pulses can be used for impulse, or baseband radar. They can also be used to gate electro-optic devices such as photocathodes and microchannel plates.

Such pulses are often produced directly in waveguides or on transmission lines in order to avoid lumped impedances. One such approach is to use a laser-triggered switch in a waveguide as described, for example, by G. Mourou in U.S. Pat. No. 4,329,686, issued in 1982. A large, expensive, pulsed laser is required. A second approach is to generate sharply-rising pulses using avalanche transistors or planar triodes, and then differentiate them using avalanche diodes. Pulse generators using this method are commercially-available. They have limited lifetimes, however. Moreover, the pulses are produced on coaxial transmission lines, which are unsuitable for driving loads that have non-coaxial symmetry, or require balanced signals.

An approach which has both economic and technical advantages is to make a pulse generator in which an intense pulsed electron beam is directed across a waveguiding structure comprising a waveguide or a transmission line. This approach was used in an experiment done by C. B. Norris and described by him in the Journal of Applied Physics, vol. 46, p. 1966, in 1975. In this experiment, a sheet electron beam was repeatedly swept along a stripline containing a semiconductor dielectric. Electron amplification was provided by the semiconductor. The beam produced electromagnetic pulses in the stripline. The pulses were made short and intense by synchronizing the velocity of the beam along the stripline with that of each pulse. The synchronization was similar to that which occurs when an electromagnetic pulse is produced by a nuclear weapon exploded just outside the earth's atmosphere. This approach was limited in practicality by the low charge per pulse available from the beam, by the low amplification of the semiconductor, and by the large size of the apparatus.

The charge can be increased by using a larger cathode. Instead of sweeping the beam, the cathode can be pulsed and a constant high voltage can be used to accelerate the electrons. A large, pulsed cathode can be made by using a pulsed laser to illuminate a photocathode in vacuum. This method was described by M. T Wilson and P. J. Tallerico in U.S. Pat. No. 4,313,072, issued in 1982. The pulsed laser has the above-mentioned disadvantages, however. Moreover, a photocathode requires an ultra-high vacuum in which to operate, and even then degrades rapidly under high-current conditions.

A pulsed cathode can also be mad by using a triode which contains a thermionic or a field-em cathode. The triode requires high-power trigger pulses, however. The trigger pulses must have durations less than or equal to those of the electron pulses that are to be generated. They are usually produced with considerable jitter.

To obtain a pulsed cathode without the above drawbacks, it can be constructed in two stages. In the first stage, low-power, low-jitter trigger pulses are used to produce a reliable, low-intensity pulsed electron beam that can cover a substantial area. In the second stage, an electron multiplier (EM) with a large area is used to amplify the beam. The amplification possible depends upon the duty cycle and area of the EM. When used intermittently, EMs can produce pulses with large electron charge densities, on the order of one nanocoulomb per $cm^2$. The total charge increases with the area of the EM. When accelerated by voltages in ,the range of tens of kilovolts, such electron pulses can attain high kinetic energies, on the order of tens of microjoules. Large electromagnetic pulses can be produced from these electron pulses, even if the energy-conversion efficiency is small.

One EM which is occasionally used indirectly to amplify broad-area electron beams is the microchannel plate (MCP). Amplification of such beams has been seen to occur in the course of measurements of the intensities of brief flashes of light. MCP photomultiplier tubes (PMTs) have been flooded with flashes, and electromagnetic pulses have been produced as a result. Examples of such measurements are provided in an article by L. P. Hocker et al. in the IEEE Transactions on Nuclear Science, vol. 26, p. 356, published in 1979. The MCP PMTs used for these measurements were not optimally-suited for producing electromagnetic pulses, however. Due to the coaxial symmetry of these devices, there was an inherent conflict between providing enough accelerating voltage, and providing impedance matching within the PMTs. Even if these problems could be solved, the resulting pulses produced would still be restricted to being negative and unbalanced, and the pulse durations would be limited by the widths of the anodes in the PMTs.

OBJECTS OF THE INVENTION

It is an object of the present invention to produce a pulsed cathode that can be operated with low power input and low jitter.

It is a further object of the present invention to provide improved waveguiding structures for electron-beam pulse generators.

It is a still further object of the present invention to produce high-energy electromagnetic pulses with durations in the 25 picosecond to one nanosecond range.

It is yet a further object of the present invention to produce these pulses using a compact, reliable vacuum tube.

SUMMARY OF THE INVENTION

The above and other objects of the present invention may be realized in an electron-beam electromagnetic pulse generator (a pulser) contained at reduced pressure in a vacuum envelope. In the pulser, a pulsed electron gun is provided. A thin, flat EM which can comprise one or more MCPs is located proximate to the electron gun. The exit of the EM is integral with the first electrode in a waveguiding structure which extends away from the gun. The first electrode and other electrodes of the waveguiding structure comprise a sequence of plates which are parallel to the EM. There is a high electron-accelerating voltage between the first and second electrodes in the sequence. There are apertures in the electrodes along a line extending away from the EM. The electron gun produces a low-intensity pulsed electron beam which is directed at the EM. The EM and the accelerating electrode amplify the beam, which passes through the apertures. In the waveguiding structure, the amplified beam induces electromagnetic pulses, which propagate down the structure to a load. If the load is at atmospheric pressure, a vacuum feedthrough is provided to conduct energy carried by the structure across the envelope to the load.

BRIEF DESCRIPTION OF THE DRAWINGS

FIG. 11 shows the pulser of FIGS. 5-6 used to gate a MCP;

FIG. 12*a* shows a view of the central portion of the embodiment of FIG. 2 just before the elecron gun is triggered by a gate pulse;

FIG. 12*b* shows an electron beam pulse incident upon a MCP EM;

FIG. 12*c* shows the subsequent production of an intense travelling amplified sheet electron beam pulse by the MCP EM, as well as the simultaneous production of co- and counter-travelling electromagnetic pulses;

FIG. 13 shows the dimensions of a transverse section of the pulser of FIGS. 1-3 that are suitable for producing a pulse as short as about 25 picoseconds in duration;

FIG. 14 shows the dimensions of a transverse section of the pulser of FIGS. 1-3 that are suitable for producing a pulse of about 400 picoseconds in duration.

DETAILED DESCRIPTION OF THE INVENTION

Figure 1:
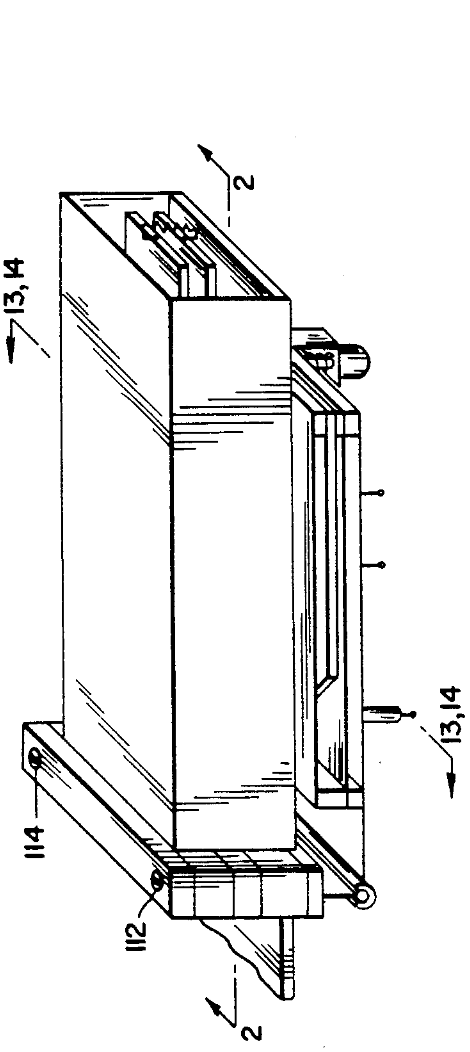
FIG. 1 shows a perspective drawing of an embodiment of the present invention that uses shielded parallel-plate electrodes to produce balanced electromagnetic pulses.

An embodiment of the pulser of the present invention using shielded parallel-plate electrodes to produce a balanced pulse is shown in FIG. 1. The construction of this embodiment is best shown using FIG. 2 with occasional reference to FIGS. 3 and 4.

As shown in these figures, the pulser contains pulsed cathode assembly 160, waveguiding structure 170, and backplane assembly 180. The pulsed cathode assembly and the waveguiding structure are cantilevered from the backplane assembly. Part of the pulsed cathode assembly can be rotated about the axis of hinge 21.

The pulsed cathode assembly includes preferred pulsed electron gun 140 and MCP EM 150. The electron gun comprises elements, 23, 24, 26, 27, 28, 30, 32, 35, 36, 38, 40-44, 46, and 47. The MCP EM comprises elements 60-66. The electron gun produces a pulse of primary electrons which strikes the entrance of the MCP EM. This pulse triggers the MCP EM, which produces an amplified pulse at its exit. The amplified pulse consists mostly of secondary electrons.

Waveguiding structure 170 comprises elements 68-71, 74-76, 78, 80, 84, 85, 88, and 90. Backplane assembly 180 comprises elements 100, 102, 104, 106, and 108 shown in FIG. s, and elements 112 and 114 shown in FIG. 1. Blocks 100, 102, and 106 of the backplane assembly are insulators, while blocks 104 and 108 are metal.

Electrons can be transported from a cathode electrode in an electron gun to a MCP EM by placing the cathode either near to, or relatively distant from, the MCP EM. The first method, commonly called proximity focusing, is the one shown in FIG. 2. In this figure, large, thin thermionic oxide cathode electrode 27 for the electron gun is mounted on thin nickel alloy foil electrode 26. It is heated indirectly by heater 25 which is an electrically-insulated tungsten wire. Indirect heating keeps the potential of the cathode constant, which is necessary for good electron optics. The temperature of the cathode is rather low, in the range 300°-400° C., because only a small amount of primary electron current is required. The low temperature promotes reliability and reduces power input. The foil is stretched tight and clamped by insulators 40-44 at its ends. The thinness of the foil retards heat flow away from the cathode. The construction and handling of oxide cathodes is well known and is described by Walter H. Kohl in *Handbook of Materials and Techniques for Vacuum Devices*, pp. 508-518 published by Reinhold in 1967. Briefly, the oxide cathode is first activated separately in vacuum apart from the MCP EM. It is then incorporated in the rest of the pulser in vacuum, or in air after exposing it to dry nitrogen or keeping it hot (150° C).

Electrodes 27, 36, and 46 form a triode. Metal screen anode electrode 46 is held by metal sheet electrode 47. Metal screen grid electrode 36 is attached to waveguiding electrode 35. This electrode comprises dielectric substrate 30, conducting film 32, and resistive film 38. Substrate 30 can be glass or ceramic. The films completely cover the substrate, except for one end. Electrode 35 is tapered both in width and height to form a constant-impedance stripline with electrodes 26 and 47. The triode is smoothly integrated into this line. The impedance of the line is equal to that of coaxial line 24, to which it is attached. This impedance is typically 50 ohms.

Resistive film 38 and metal wedge 28 together form a nearly impedance-matched termination for the stripline. The wedge has a linear taper and does not quite touch film 38, so that a bias voltage can exist between cathode 27 and grid 36 to confine electrons to the cathode between pulses. On each side of electrode 35, film 38 has a resistance per unit length which is equal to the characteristic impedance of the stripline divided by the length of wedge 28.

Electron gun 140 includes baseplate 23. The baseplate is supported by bracket 20 and hinge 21 at one end, and by insulator 58, bracket 56, and linear translator 55 at the other end. The linear translator comprises solenoid 52 spring 50, and shaft 54. It is used to vary angle 22 by moving the shaft in response to a change in electric current in the solenoid. It must be made vacuum compatible and heat tolerant.

The MCP EM contains MCPs 64 and 66. A MCP is a thin plate of a special glass, which has millions of tiny pores extending between its faces. Each face is coated with a thin layer of metal which acts as an electrode. A bias voltage is present between the electrodes which causes each pore to act as an electron multiplier. Electron multiplication occurs in one direction only, depending on the polarity of the bias voltage. Accordingly, there is an entrance face and electrode through which primary electrons enter the pores, and an exit face and electrode through which both primary and secondary electrons leave.

The use of two MCPs rather than one reduces the primary electron current needed to trigger the EM. When two MCPs are placed in tandem and separated by about 100 microns with the pores of the first MCP slanted oppositely to the pores in the second, the arrangement is known as a chevron. In the chevron, high gain is achieved by causing electrons from a pore in the first MCP to spread out to multiple pores in the second MCP. . Maximum gain is achieved if each MCP is operated in the so-called pulsed mode, with a bias of about 1000 volts. In this mode, each pore completely discharges after being triggered, ejecting a pulse of about $10^4$ electrons. The most intense output pulse of electrons from the chevron occurs when the triggering input pulse is sufficient to cause all pores in the second MCP to discharge simultaneously.

After being discharged each pore in the subject to a dead time during which it is relatively insensitive to further excitation. This dead time sets a limit to the maximum rate at which the EM can produce output pulses without gain degradation. This rate is in the range 1–2 kHz if the second MCP has a high strip current.

It is desirable that the duration of the output pulse of electrons from the chevron be as short as possible. There are two triggering techniques which can be used to produce short output pulses. The first technique is to use an input pulse which is at least a short as the output pulse expected. It is difficult or expensive, however, to produce a sufficiently-short input pulse. The second technique is to use a relatively-long input pulse which has an intense, fast-rising leading edge. The second MCP then discharges completely after the arrival of the current in a portion of the leading edge of the input pulse. This results in a short, standard output pulse regardless of the current in the remainder of the input pulse. In this latter case, the MCP EM acts as a nonlinear pulse amplifier which is analogous to the monostable multivibrator, or "one-shot" familiar in electronics.

Besides fast triggering, there are other methods of reducing the duration of the output pulse. Thin MCPs with small pores can be used. The metallization of the ends of MCP pores ("end spoiling") can be eliminated to reduce space charge near the exits of the pores. Finally, the pore entrances of MCP 64 can be coated with a substance such as MgO which has a high coefficient of secondary electron emission In the construction of the MCP EM shown in FIG. 2, metal skirt 62 extending from electrode 63 shields electron gun 140 from the voltage on electrode 68. Electrical lead 61 is connected to electrode 63, and lead 60 is connected to metal spacer 65. It is possible to make the spacer of metal-coated insulator, and run the two sides of the spacer at different potentials in order to accelerate electrons between the two MCPs. This would require an electrical lead in addition to 60. Acceleration of electrons between MCPs decreases the duration of the output pulse, but also decreases the gain of the MCP EM.

Figure 2:
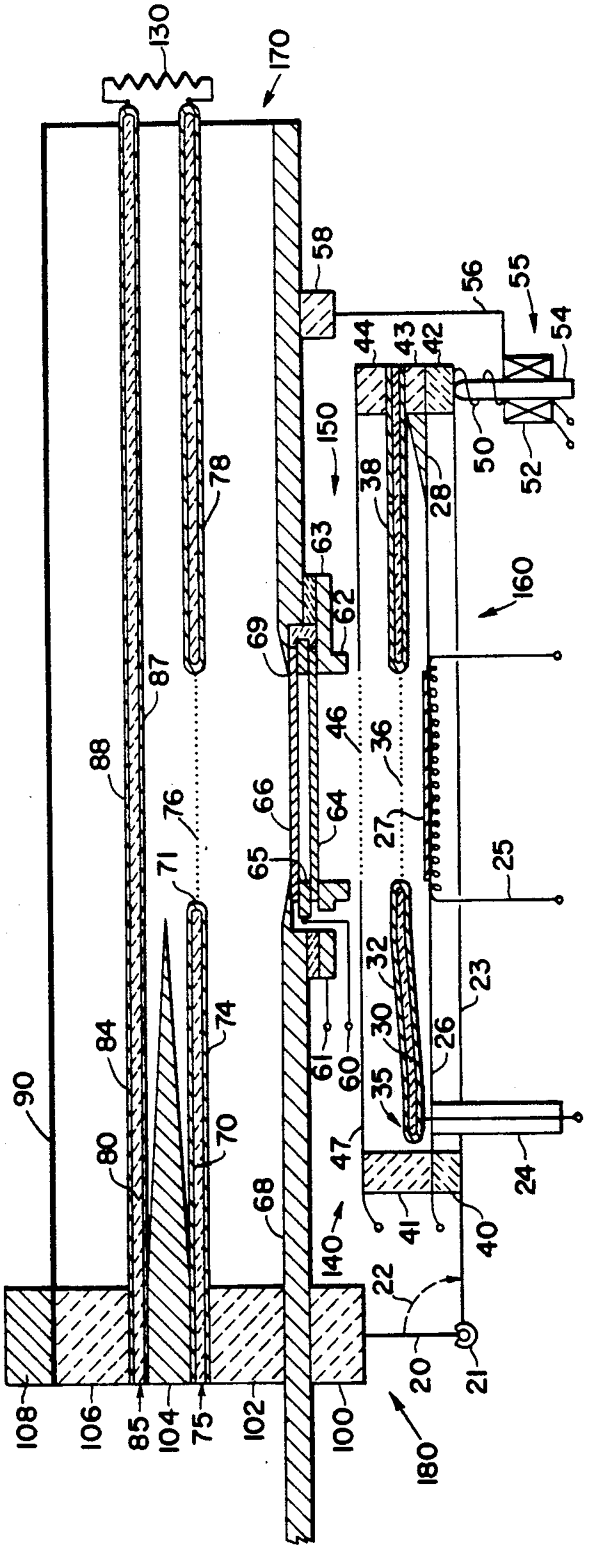
FIG. 2 shows a longitudinal midsection of the embodiment of FIG. 1.

The output pulse from the MCP EM needs to be accelerated, formed into a beam, and directed through the waveguiding structure. In the embodiment of FIG. 2, this is done by proximity focusing, using a diode comprising the exit electrode of MCP 66 and the region of electrode 75 proximate to this electrode. This diode differs from that in commercial MCP PMTs and similar detectors by being capable of withstanding a higher accelerating voltage, and by being integrated smoothly into a waveguiding structure. The high voltage capability is achieved by maintaining a sufficient gap between electrodes 68 and 75 at all points, and by minimizing field emission from electrode 68 and the exit electrode of MCP 66. The transition between the diode and the waveguiding structure is made as smooth as possible to minimize impedance inhomogeneity.

The electrodes of the waveguiding structure in FIG. 2 include two intermediate electrodes 75 and 85 as well as a grounded shield. The shield includes the exit electrode of MCP 66, metal electrodes 68 and 90, and metal sidewalls 93 and 94 shown in FIG. 3. (The sidewalls can be omitted if electrodes 68 and 90 are wide enough to shield electrodes 75 and 85.) Apertures 69 and 71 are present in electrodes 68 and 75, respectively. Electrodes 68, 75, 85, and 90 form a sequence of four parallel plates.

The waveguiding structure has first and second ends. The electrodes are clamped and supported at the first end by backplane assembly 180. Apart from this assembly, the electrodes are self supporting along their length. They are unencumbered by the dielectric supporting material usually present in parallel-plate structures. The absence of this material results in a homogeneous vacuum dielectric medium for electromagnetic waves.

Electrode 68 extends to the left of the backplane assembly and makes contact with the vacuum envelope., thereby supporting the pulser in the envelope. The MCP EM is located in aperture 69 of this electrode.

Electrodes 75 and 85 are preferably made of thin, plane, stiff dielectric insulators 70 and 80 such as glass or ceramic, around which conductive and resistive films are placed. Films 78 and 88 are conductive, while films 74 and 84 are resistive. For the purpose of illustration, the films are shown to be relatively thicker than they are in practice.

Aperture 71 is preferably covered by screen 76. If the screen is omitted, the cross section of the waveguiding structure varies substantially along its length, leading to a corresponding variation in impedance. In addition, the uncovered aperture forms a strongly-diverging lens, which spreads out the beam from the MCP EM.

Electron absorber 87 comprising a sheet of material having good conductance and low secondary emission is situated on electrode 85 facing screen 76. The sheet be graphite covered by a high-transparency copper screen.

Load 130 is placed between the two intermediate electrodes at the second end of the waveguiding structure. It can be localized, or it can be an extended object such as an antenna, or a transformer section and its load. Also, the load can be under vacuum along with the pulser, or it can be in air, connected to the pulser by a vacuum feedthrough and a transmission line. The symmetrical linearly-tapered metal wedge forming one end of block 104 is part of a matched termination.

The waveguiding structure can support two types of waves. The first type is a balanced, or differential wave. In this type of wave, the average value of the voltages of the intermediate electrodes with respect to the shield is zero. The second type is an unbalanced, or common wave. In this case, the average value of the voltages is non-zero. Since the structure can support a balanced wave, it is classified in the art as balanced. A structure which can only support an unbalanced wave is classified as unbalanced.

Figure 3:
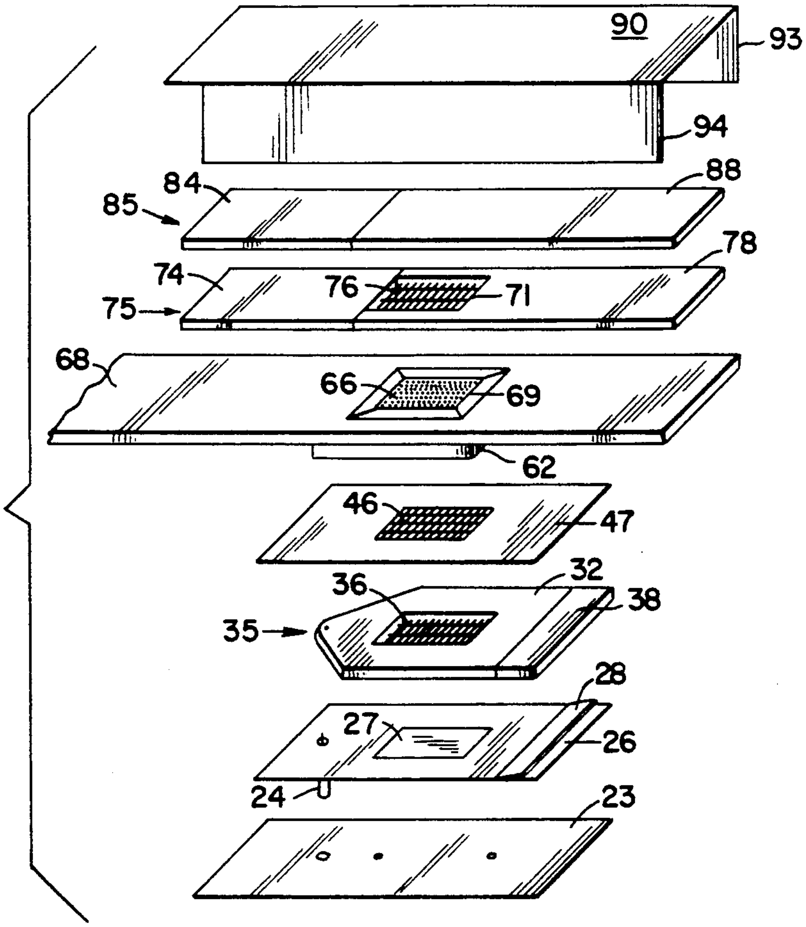
FIG. 3 is an exploded view of the parallel plate electrodes and the sidewall electrodes shown in FIG. 1.

The balanced wave is of principle interest for the embodiment of FIGS. 1–3. It is desirable that waves of this type be composed only of a transverse electromagnetic (TEM) mode in order to avoid dispersion. TEM-mode conditions are ensured if (1) the waveguiding structure has a homogeneous dielectric medium, and if (2) the widths and separation of the intermediate electrodes are less than half the shortest wavelength, present in the Fourier decomposition of an electromagnetic pulse carried on the electrodes.

Balanced waves travel in both directions along the waveguiding structure Waves travelling rightward in the embodiment of FIG. 2 are absorbed to varying degrees by load 130, which may or may not be impedance-matched. Leftward-travelling waves are absorbed by the matched termination assembly comprising resistive films 74 and 84, and the wedge at one end of block 104. For each side of electrodes 75 and 85, the resistance per unit length of each of films 74 and 84 is made approximately equal to 0.75 $Z_o/L$. Here, $Z_o$ is the impedance of the waveguiding structure without the wedge, and L is the length of the wedge. The more acute the angle of the apex of the wedge, the better the impedance match provided by the termination.

Unbalanced waves are not of practical interest for the embodiment of FIGS. 1–3. Energy from this mode is absorbed by film resistors 74 and 84.

The film conductors and resistors can be made by either thin-film or thick-film techniques. In the thin-film approach, metal is deposited in vacuum upon a material such as glass, the thickness and conductivity of the film determining the resistance. In the thick-film approach, conductive or resistive inks are rolled onto a ceramic substrate and fired at about 850° C. to form hard glazes. For the present invention, the latter approach is preferable because of its convenience and low cost. The thick-film resistors can be made thinner than the skin depth for the highest frequency component carried, a necessary requirement for broad-band performance. The preferred ceramic is alumina, which is laser-machinable. The inks are available from The Dupont Company, Wilmington, Del.

Figure 4:
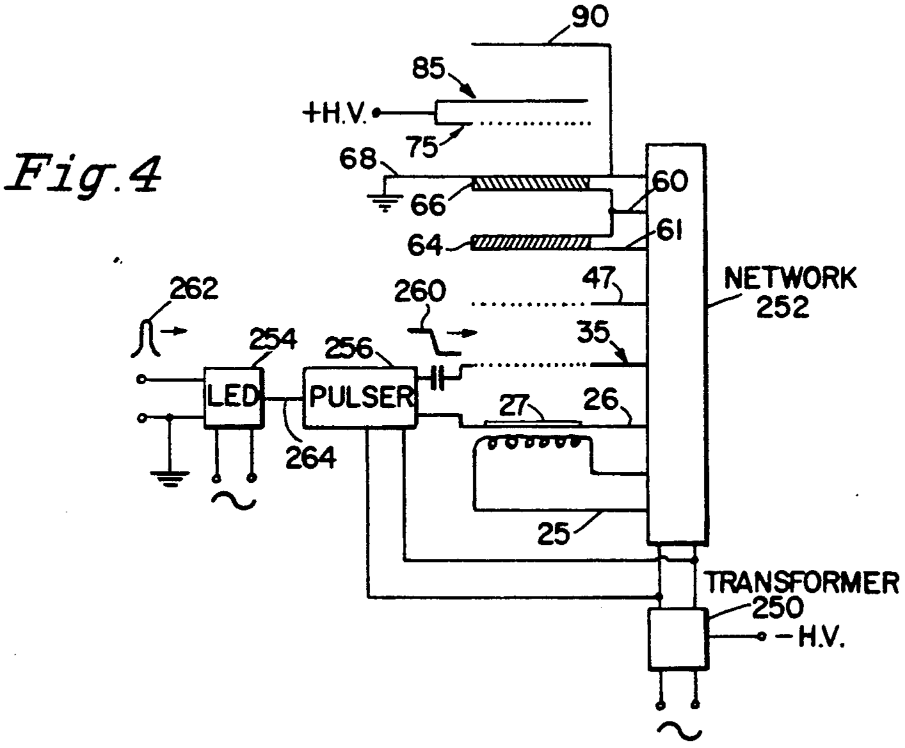
FIG. 4 shows the electrical circuitry and components of the embodiment of FIGS. 1-3.

An electrical network that can be used to drive the electron-beam pulser of FIGS. 1–3 is shown in FIG. 4. Electrodes 75 and 85 of the waveguiding structure are held at a high positive voltage. This voltage can be constant, or it can be in the form of a pulse which is long compared to that which is to be generated. The shield comprising electrodes 68 and 90 is held at ground potential. Electromagnetic pulses carried by the waveguiding structure are added to these constant voltages. The voltages for the pulsed cathode assembly and the diode are supplied from bias and power distribution network 252, the design of which will be apparent to those skilled in the art of electron gun construction. Power to the network is supplied through highvoltage isolation transformer 250, the secondary of which is floated at a high negative voltage. Positive step function gate pulse 260 is supplied to electrode 35 by pulser 256. This pulser can be free-running (periodic), or externally-triggered by the user (aperiodic) using pulse 262. External triggering adds some jitter to the system. Pulse 262 is first converted to an optical pulse using an electro-optic transducer 254 such as a fast LED. The optical pulse is transmitted over electrically-insulating fiber-optic cable 264 up to high voltage at pulser 256. There, the optical pulse triggers a transducer such as an avalanche photodiode or an avalanche phototransistor to produce electrical pulse 260.

It is desirable to be able to produce types of subnanosecond electromagnetic pulses which are different from that produced by the embodiment of FIGS. 1–3. Each new type of pulse would be distinguished by a different polarity, balance, or bias. These pulse types can be produced by modififying the foregoing waveguiding structure.

The preferable waveguiding structures for the pulser are arrangements of parallel, elongated electrodes. Each structure has a substantially-unchanging cross-section along the direction of elongation: Electromagnetic energy can propagate on the structure both along and opposite to this direction. The structure is finite in length, with first and second ends.

A given structure should be capable of supporting pure TEM-mode waves. This can prevent the dispersion and consequent pulse-broadening that would result from the presence of other modes. Also, the structure should be capable of accommodating a substantially-flat MCP EM, and permitting proximity focusing.

The first of the above two requirements argues against using hollow structures, which cannot support TEM-mode waves. Such structures include the usual hollow microwave waveguides. The second requirement argues for structures which contain stacks of parallel plates, similar to the structure in FIGS. 1–3.

One such structure could comprise the merging of electrodes 75 and 85 in FIG. 2 to form a single interior electrode. A unipolar, negative, unbalanced pulse would be produced. Because of the accelerating voltage present on the interior electrode, load 130 would be restricted to being capacitive. Besides not being able to drive purely-resistive loads, however, an embodiment with this structure would have the disadvantage of producing longer, lower-energy pulses than otherwise possible. This is because electrons enter the structure with low energies.

Figure 5:
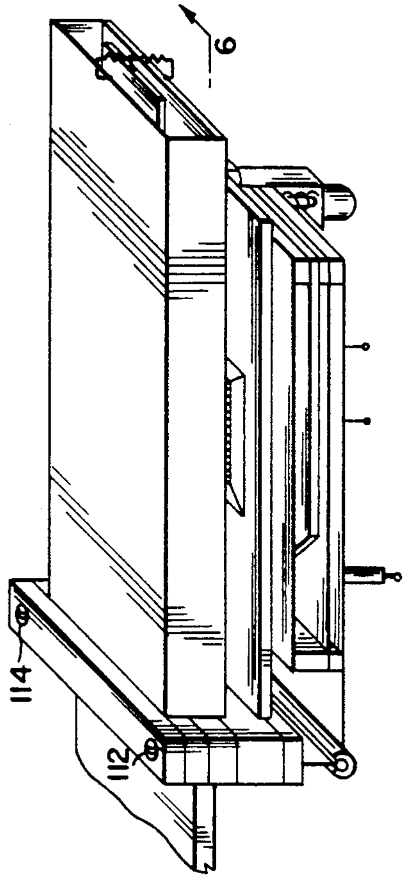
FIG. 5 shows a perspective drawing of an embodiment of the present invention that uses a shielded parallel-plate electrode to produce unbalanced electromagnetic pulses.
Figure 6:
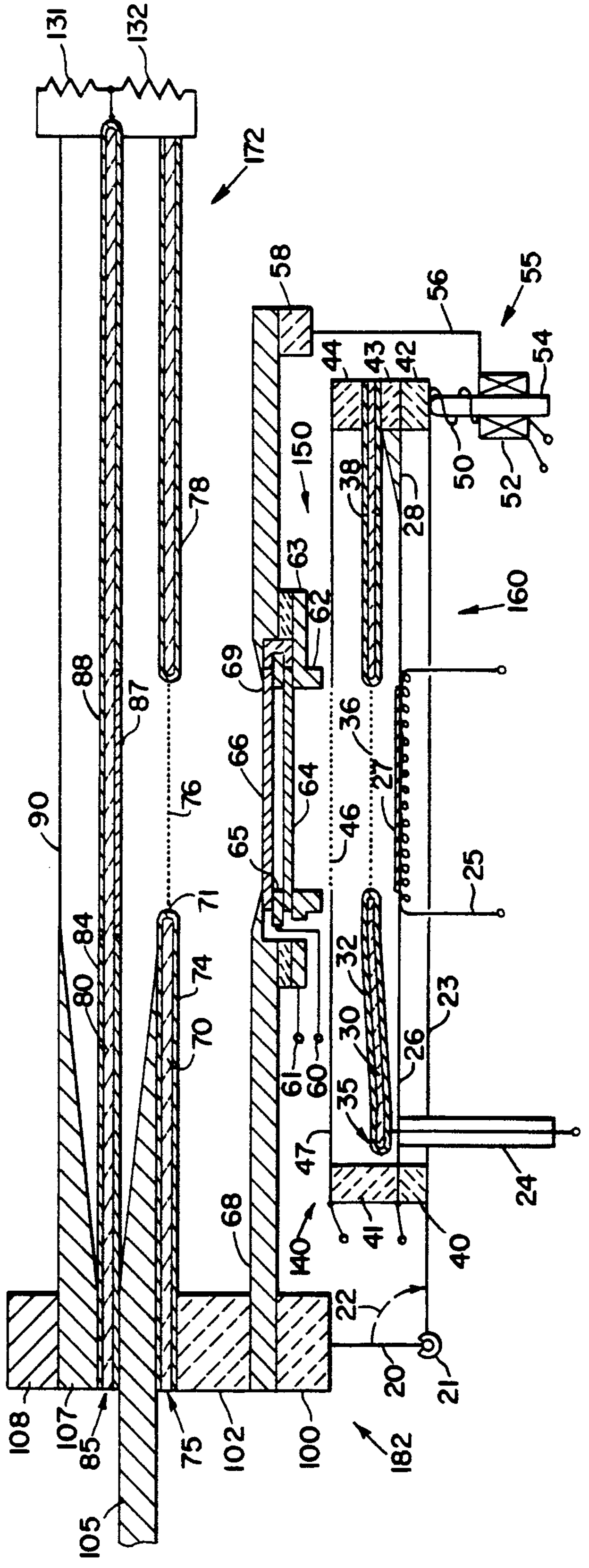
FIG. 6 shows a longitudinal midsection of the embodiment of FIG. 5.

A structure which solves these problems is contained in the embodiment shown in FIGS. 5 and 6. Electrodes 75, 85, and 90 in FIG. 6 are all held at ground potential prior to the pulse. They are supported by backplane assembly 182 which comprises elements 100, 102, and 108 shown in FIG. 2, and elements 112 and 114 shown in FIG. 5. They are separated by wedged metal plate 105 and wedged metal block 107. Plate 105 also serves as a support for the pulser. On each side of electrode 85, film 84 has resistance per unit length equal to 0.5 $Z_o/L$. Loads 131 and/or 132 are positioned between electrode 85 and electrodes 75 and 90. Electrode 68 and pulsed cathode assembly 160 are then held at a high negative potential.

If there are no other electrodes near the waveguiding structure of FIGS. 5–6 then electrode 90 as well as the wedged portion of block 107 can be omitted (not shown). On each side of electrode 85, film 84 has resistance per unit length equal to $Z_o/L$.

A variation of the structure in FIGS. 5-6 is one in which the region of electrode 85 containing absorber 87 is replaced by an aperture and a screen like those in electrode 75 (not shown). The absorber is then placed on the underside of electrode 90. A bipolar, unbalanced pulse is produced.

Another variation of the structure in FIGS. 5-6 is one in which a new electrode and block are added (not shown). A gap is opened between block 105 and electrode 85. A block and electrode like 104 and 75 in FIG. 2 are inserted into the gap. The wedge-shaped portions of blocks 105 and 107 can be omitted. All electrodes of the waveguiding structure but electrode 68 are held at ground potential. The grounding of the waveguiding structure can be an advantage for some applications. As in the embodiment of FIGS. 1-3, both balanced and unbalanced pulses are produced. The energy output of the balanced pulse is lower, however, due to the additional gap the electron beam must cross.

To trigger MCP EMs in embodiments using parallel plates, other electron guns are possible than the preferred gun shown in FIGS. 1-3 and 5-6. These guns can either use proximity focusing, or they can use cathodes which are relatively-distant from the MCP EM. They have both advantages and disadvantages with respect to the preferred gun.

Figure 7:
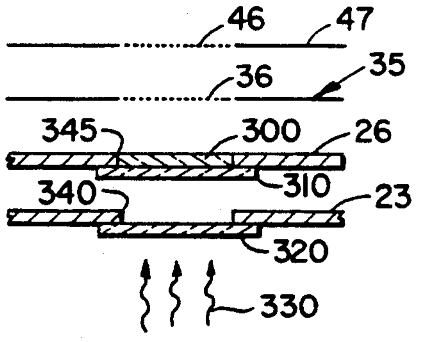
FIG. 7 shows an alternative triggering electron gun which is a phototriode.

Among the possible alternative electron guns using proximity focusing is one incorporating a phototriode, which is shown in FIG. 7. (The electrodes shown in this figure have the same orientation as that used in FIGS. 2 and 6.) In comparison with the triode shown in FIG. 2, oxide cathode 27 and heater 25 are not present. Apertures 340 and 345 are made in baseplate 23 and electrode 26, respectively, to allow light to pass through. The apertures are covered from beneath by transparent windows 310 and 320. Semitransparent photocathode electrode 300 is placed on window 310 in contact with electrode 26. Light beam 330 from a steady source such as a lamp excites the photocathode. The light source is preferably spectrally-matched to the photocathode, and located outside the vacuum envelope. The phototriode consists of electrodes 300, 36, and 46. It is smoothly integrated with the adjoining transmission line. It is simpler than the former triode, but it requires ultra-high vacuum to protect the photocathode. The presence of the light source is also required.

Figure 8:
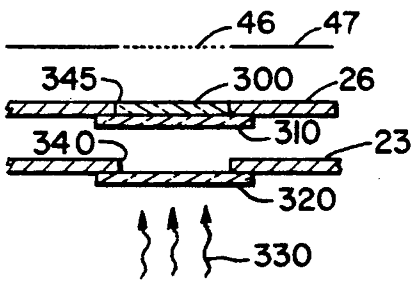
FIG. 8 shows an alternative triggering electron gun which is a photodiode.

By removing electrode 35 in FIG. 7, an electron gun incorporated a photodiode instead of a phototriode can be made. The resulting gun is shown in FIG. 8. The photodiode portion consists of electrodes 300 and 46. A transmission line is not employed. Light beam 330 is supplied by a pulsed, rather than a steady, light source. The beam needs to have a flat front face with sufficient area to cover the photocathode. The light source can be a compact solid-state laser followed by a laser-beam expander. The photodiode or the face of the light beam can be tilted with respect to the MCP EM. The resulting gun is simpler than one employing a phototriode, but the pulsed light source is larger and more expensive than a steady light source.

Another electron gun using proximity focusing is one employing a capacitive triode containing a thermionic cathode. Such triodes are available from Varian Eimac, Salt Lake City, Utah. While simpler than the travelling-wave triodes which have been described, the timing performance of capacitive triodes is inferior.

Electron guns can also be used in which the cathodes are relatively-distant from the MCP EM. In these guns, the cathodes are smaller than the MCP EM, and electron-optical components are used to spread out the electron beam. While these electron guns have smaller cathodes than ones using proximity focusing, they must be aligned essentially perpendicular to the MCP EM rather than parallel to it, thereby making the pulser substantially larger. Magnetic shielding is also required in some instances.

One of these electron guns produces a swept-sheet electron beam. This type of gun is described by C. B. Norris in the article which has been cited.

Figure 9:
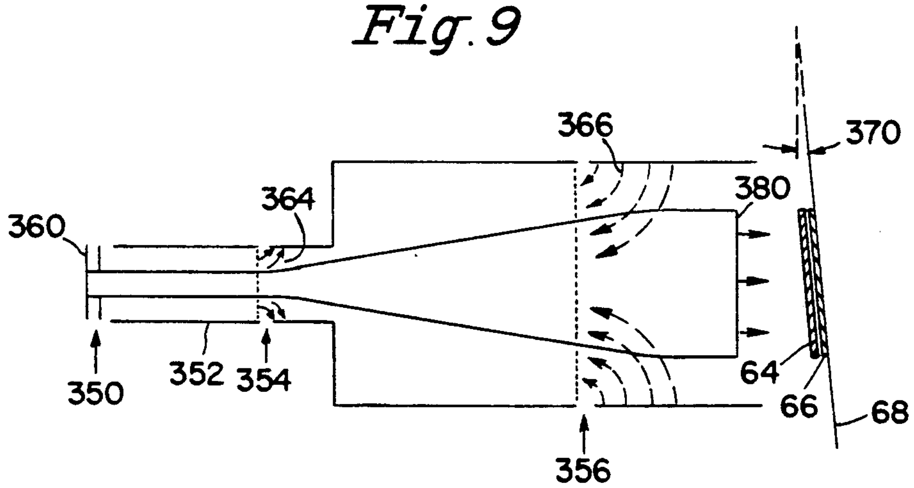
FIG. 9 shows an alternative triggering electron gun which includes a thermionic cathode and a beam expander.

Other guns with distant cathodes produce expanded electron beams. An example of one of these guns is shown schematically in FIG. 9. There, small pulsed triode 350 is followed by a beam expander comprising small resistive accelerating tube 352, and gauze lenses 354 and 356. The lines of force in the gauze lenses are indicated by dashed lines 364 and 366. Electron beam pulse 380 is produced. The gun can have either axial or two-dimensional symmetry. In the case of axial symmetry, cathode 360 is short and can be directly-heated. The gun can be tilted by angle 370 with respect electrode 68. In the case of two-dimensional symmetry, angle 370 is zero. Also, cathode 360 extends perpendicular to the plane of the drawing, and is indirectly heated. The gun in this case is positioned and operated like that in FIGS. 1-3 and 5-6, the only difference being that the cathode is farther away from the MCP EM.

Figure 10:
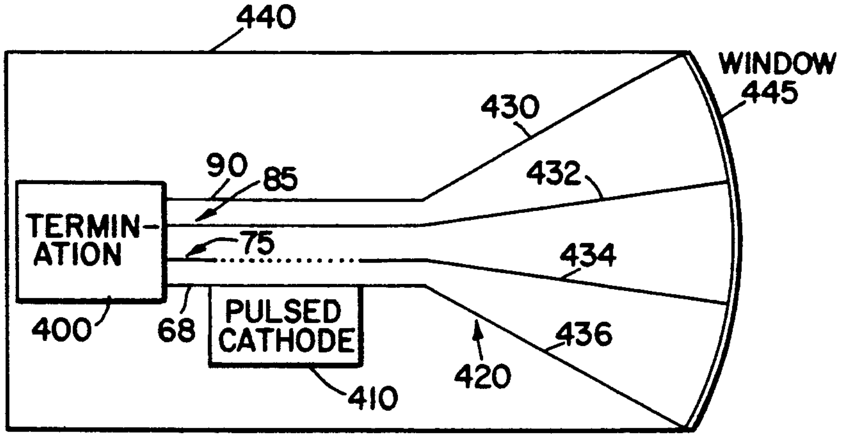
FIG. 10 shows the pulser of FIGS. 1-3 used to make a transmitter for electromagnetic pulses.

Applications of electron-beam pulsers using parallel-plate waveguiding structures are shown in FIGS. 10 and 11. In FIG. 10, a pulser of the type shown in FIGS. 1-3 is used to make a transmitter for electromagnetic pulses. Load 130 takes the form of electromagnetic horn 420. The termination and backplane assemblies, and the pulsed cathode assembly of FIG. 2 are represented by rectangles 400 and 410, respectively. Other parts of FIG. 2 have been omitted or simplified. Electrodes 430, 432, 434, and 436 of the horn can be resistively loaded for good broad-band performance in a relatively-short length. This technique is described by M. Kanda on pp. 155-163 in *Time-domain Measurements in Electromagnetics*, edited by E. K. Miller and published by Van Nostrand in 1986. Loading can be done using thick film resistors on ceramic. Relatively-transparent insulating window 445 functioning as a radome is present in vacuum envelope 440 at the end of horn 420. The window can be made of glass or quartz.

In FIG. 11, a pulser of the type shown in FIGS. 5-6 is used to gate MCP 485. The gating permits a snapshot of radiation source 480 to be obtained at imaging detector 470. Termination and backplane assemblies 450 and 475, respectively are used at the ends of the pulser. They are different from assembly 400 in FIG. 10 because a different waveguiding structure is used.

Operation of the Invention

FIGS. **12*a*-12*c* show the essential steps that occur between gating the pulser and producing an electromagnetic pulse. These figures represent the operation of the pulser of FIGS. 1-3. (Similar figures can be drawn for the pulser of FIGS. 5-6.) Gate pulse 260 (see FIG. 12*a*) travels down the stripline formed by electrodes 26, 35 and 47 at a speed substantially equal to c, the speed of light in vacuum. The pulse initiates low-intensity electron beam pulse 380 shown in FIG. 12*b*. The front face of this beam pulse leaves cathode 27** synchronously with the passage of the leading edge of pulse 260. After acceleration by electrodes 35 and 47, the beam pulse has an essentially-flat front face, which is tilted to the right with respect to the entrance face, of MCP 64. The two faces then intersect in a region 690 (see FIG. 12c), and this intersection region travels at a certain velocity. If angle 22 of FIG. 2 is within a small neighborhood of 90°, the magnitude of this velocity is substantially equal to c. After triggering by beam pulse 380, the MCP EM comprising MCPs 64 and 66 produces intense sheet electron beam pulse 660 (see FIG. 12c). (The pulse is drawn thinner, than it actually is.) It passes across gaps 650 and 655 (see FIG. 12a) before striking electrode 85 and being absorbed there. In passing through aperture 71, beam pulse 660 intersects screen 76 in a region 692 (see FIG. 12c). If the above condition on angle 22 holds, then this intersection region travels at a velocity with magnitude close to c. (If screen 76 is absent, then a corresponding intersection occurs between the beam pulse and aperture 71 of electrode 75.)

As beam pulse 660 crosses diode gap 650 and gap 655 between electrodes 75 and 85, it loses energy. The energy loss is due to decelerating electric fields induced in the gaps, which are associated with currents induced in the neighboring electrodes. (The energy-loss mechanism is explained in *Vacuum Tubes*, by K. R. Spangenberg, pp. 537–540, published by McGraw-Hill in 1948.) The energy lost by beam pulse 660 in the decelerating field of gap 655 is gained by two electromagnetic pulses 670 and 680 (see FIG. 12c) generated in the gap. These two pulses travel at speed c in opposite directions along the waveguiding structure comprising electrodes 68, 75, 85, and 90. If the above condition on angle 22 holds, the velocity of pulse 670 is substantially synchronized with the velocity of intersection region 692. The beam pulse and the electromagnetic pulse then overlap in gap 655 throughout the duration of the beam pulse. Pulse 670 can be regarded as a shortened, amplified, and delayed version of pulse 260. Pulse 670 is utilized in load 130 of FIG. 2, whereas pulse 680 is absorbed in the termination assembly shown there.

Velocity synchronization yields the shortest, most intense electromagnetic pulses. For operation in this mode, the linear translator 55 of FIG. 2 can be omitted. Alternatively, the velocities can be de-synchronized to stretch pulse 670. This can be done by making angle 22 either substantially greater than or substantially less than 90°. Pulse 670 has less energy as a result of stretching, however.

The energy carried by pulse 670 increases as the accelerating potential increases. It is maximized when the spacing between electrodes 75 and 85 is made equal to the mean thickness of beam pulse 660. This thickness increases with accelerating potential.

In order for the velocity-synchronization method to work, it is necessary that beam pulse 380 have a nearly-flat front face and that beam pulse 660 not blow up due to space charge. The first requirement can be satisfied by a gun using proximity focusing. It can also be satisfied by a gun like that shown in FIG. 9. In this gun, the required beam shape is produced by first diverging beam pulse 380 with lens 354 and then converging it with lens 356.

The effects of space charge in the pulser can be significant. Beam pulse 660 expands both along and transverse to its direction of travel due to electrostatic forces. The expansion can be reduced by making gap 650 as small as possible, and by making the accelerating field there as high as possible. The accelerating field is limited by field emission from the exit electrode of MCP 66 and from electrode 68. Field emission can be reduced by using tungsten or another high work-function metal for the surfaces of these electrodes. The accelerating field is also limited by practical considerations such as the allowable size of the vacuum feedthrough used to transport high voltage to the pulser. These considerations limit the maximum accelerating voltage to about 50 kV.

It is desirable to minimize the decelerating field in gap 650. This field is substantially smaller than that which would exist in the diode gap in a standard MCP photon or particle detector. This is because (1) the waveguiding structure adjoining gap 650 has a low impedance, and (2) it is long enough to prevent current induced in the structure from reflecting back into the diode during the passage of beam pulse 660. By comparison, the diode for a standard detector employing a MCP is connected to one or more wires or resistors, which have high impedances, and which immediately reflect current back into the diode.

Specifications for a pulser of the type shown in FIGS. 1–3 will now be given. The pulser will employ velocity synchronization, and the output electromagnetic pulses will be made as short as possible.

Short electromagnetic pulses are best produced with short electron pulses. Therefore, as mentioned earlier, small-pore MCPs should be used. By removing electrode 35 in FIG. 7, an electron gun incorporating a photodiode instead of a phototriode can be made. The resulting gun is shown in FIG. 8. The small dimensions are offset by the large electron densities available from small-pore MCPs.

The smallest pore diameter that can be obtained in commercial MCPs is 4 microns. FIG. 13 shows the essential transverse dimensions of a pulser using MCPs with these pores. Interior electrodes 75 and 85 are biased 10–20 kilovolts positive with respect to the shield, which includes electrodes 68 and 90. The duration of each synchronized electromagnetic pulse produced is about 25 picoseconds full-width at half-maximum. The dimensions are small enough to ensure TEM-mode conditions.

The energy of each pulse produce by this pulser depends upon the length of the MCPs and their associated electrodes. The length of MCPs 64 and 66 can be made about 50 millimeters. Two or more MCP segments can be placed end-to-end to achieve the desired length. For MCP 66, care has to be taken to ensure that the joints between segments have low resistances in order to conduct the induced currents. The pulse energy is then at least a few microjoules.

In the electron gun used to trigger the MCP EM in the pulser FIG. 13, the parameters are chosen so that the electric field in the triode is constant after the risetime of pulse 260 (see FIG. 4). The risetime is also made shorter than the time of flight of electrons between cathode 27 and grid screen 36. These conditions can be established by using a pulse with an amplitude of about 50 V and a risetime better than about 500 picoseconds, and using about 500 V between anode screen 46 and cathode 27.

To produce pulses with longer durations, pulse stretching can be used, as has been mentioned. A particular option is to trigger the entire MCP EM instantaneously. This can be done by setting angle 22 at a value less than 90° which is consistent with the voltage on screen 46. (The front face of beam 380 and the entrance face of MCP 64 then intersect at an infinite velocity.)

To make up for the loss in pulse energy that results from stretching, the size of the pulser can be increased. This permits a larger MCP EM to be used. The larger size is made consistent with TEM-mode operation. Also, the impedance of the waveguiding structure is maximized subject to the dimensional constraints which have been discussed.

The essential transverse dimensions of an enlarged pulser are shown in FIG. 14. The MCPs have active regions that are 15 mm wide and 100 mm long. They have pore diameters of about 12 microns. The interior electrodes are held at 5-10 kV. With these parameters, and with instantaneous triggering, the duration of the pulse produced is about 400 picoseconds. The pulse energy is at least a few microjoules.

To protect the oxide cathode and the MCP EM of a pulser, it is desirable that it operate in a pressure environment of $10^{-6}$ Torr or less. If the pulser is situated in a permanent vacuum tube, a getter should be used to reduce the pressure to a safe level.

It can be seen from the foregoing description that the pulse generator of the invention can be used to provide improved performance for a variety of applications using compact, reliable, and economical devices. While the description contains many specificities, these should not be construed as limitations on the scope of the invention, but rather as exemplifications of several embodiments thereof. Accordingly, the scope of the invention should be determined not by the embodiments illustrated, but by the appended claims and their legal equivalents.

What is claimed is:

1. An electromagnetic pulse generator comprising:

a vacuum envelope;

a waveguiding structure in said envelope, with first and second ends and including a sequence of four substantially-parallel plate electrodes, said four electrodes aligned in parallel between said first and second ends, and said sequence of four electrodes separated by a sequence of three gaps, said sequences of electrodes and gaps oriented so that a first one of said gaps is located between first and second ones of said electrodes;

means for supporting said electrodes in said envelope;

respective apertures disposed in said first and second ones of said electrodes, said respective apertures in alignment at a position between said ends, said alignment defined by a line which is substantially perpendicular to said electrodes;

a screen electrode extending across said aperture in said second plate electrode;

a chevron electron multiplier located at said aperture in said first plate electrode, said chevron multiplier comprising first and second substantially-flat parallel microchannel plates, said second microchannel plate extending across said aperture in said first plate electrode, and said first microchannel plate located proximate said second microchannel plate and outside said waveguiding structure;

a high, positive, constant voltage is applied to said second plate electrode and a third one of said plate electrodes, while said first plate electrode and a fourth one of said plate electrodes are connected to ground;

an electron gun located outside said waveguiding structure, along said line, and located proximate said first plate electrode, said electron gun having a negative voltage with respect to said first electrode;

said microchannel plates of said electron multiplier having electron entrance surfaces oriented toward said electron gun, and electron exit surfaces oriented away from said gun;

a fast-rising pulse is applied to said electron gun, said pulse initiating a low-intensity pulsed electron beam from said gun, said electron beam accelerated toward said electron multiplier by said negative voltage and thereby attaining a resulting beam velocity, said electron beam having a substantially-flat front surface composed of electrons, which is inclined at an angle of inclination with respect to said entrance surface of said first microchannel plate of said electron multiplier;

said electrons in said front surface of said electron beam first making contact with said entrance surface of said first microchannel plate of said electron multiplier at a narrow intersection region where said front surface of said beam and said entrance surface of said first plate converge;

said electrons in said front surface of said electron beam at said intersection region being promptly amplified nonlinearly by said two microchannel plates, said amplification comprising an immediate, complete discharge of said second plate in a narrow region of said second plate proximate said first intersection region and parallel to it;

said first intersection region moving along said entrance surface of said first microchannel plate toward said second end of said waveguiding structure at a velocity determined by said beam velocity and said angle of inclination, and said amplified electrons being accelerated toward said second plate electrode by said voltage on said second plate electrode, said electron multiplier and said second plate electrode thereby acting to create an intense sheet electron beam from said low-intensity, pulsed electron beam;

said sheet electron beam proceeding across said first gap and through said screen in said second plate electrodes, and being inclined with respect to said screen, crossing said screen in a second intersection region, said second intersection region also travelling with said velocity of said first intersection region toward said second end of said waveguiding structure;

said sheet electron beam crossing a second one of said gaps before being absorbed at said third plate electrode;

said sheet electron beam generating two transverse-electromagnetic pulses in said second gap, said generation initiated where said sheet beam begins to cross said screen, and terminated where the last of said sheet beam is absorbed at said third electrode, after which said pulses travel respectively toward said ends of said waveguiding structure at the speed of light in vacuum.

2. A device as defined in claim 1, wherein said supporting means comprises a backplane assembly located at said first end of said waveguiding structure.

3. A device as defined in claim 1, wherein said second and said third plate electrodes comprise ceramic on which conductive and resistive thick films are present on adjacent regions of said electrodes.

4. A device as defined in claim 3, wherein said ceramic is alumina.

5. A device as defined in claim 1, further including means for controlling said velocity of motion of said two intersection regions, wherein said means comprises a hinge connecting said electron gun to one of said ends of said waveguiding structure, and a linear translator connecting said electron gun to the other of said ends of said waveguiding structure, said hinge and said linear translator permitting said angle of inclination to be varied.

6. A device as defined in claim 5, wherein said velocity of said first and second intersection regions has a magnitude substantially equal to the speed of light in vacuum.

7. A device as defined in claim 11, wherein said electron gun includes three thin, substantially-flat electrodes, said flat electrodes comprising cathode, grid, and anode triode electrodes joined in turn to three stripline electrodes.

8. A device as defined in claim 7, wherein said cathode of said triode is a thin oxide electrode and said stripline electrode, to which said cathode is joined, is a metal foil.

9. A device as defined in claim 7, wherein said cathode is a photocathode which is excited by a steady light source.

10. An electromagnetic pulse generator comprising:

a vacuum envelope;

a waveguiding structure in said envelope, with first and second ends and including a sequence of three substantially-parallel plate electrodes, said three electrodes aligned in parallel between said first and second ends, and said sequence of three electrodes separated by a sequence of two gaps, said sequences of electrodes and gaps oriented so that a first one of said gaps is located between first and second ones of said electrodes;

means for supporting said electrodes in said envelope;

respective apertures disposed in said first and second ones of said electrodes, said respective apertures in alignment at a position between said ends, said alignment defined by a line which is substantially perpendicular to said electrodes;

a screen electrode extending across said aperture in said second plate electrode;

a chevron electron multiplier located at said aperture in said first plate electrodes, said chevron multiplier comprising first and second substantially-flat parallel microchannel plates, said second microchannel plate extending across said aperture in said first plate electrode, and said first microchannel plate located proximate said second microchannel plate and outside said waveguiding structure;

a high, negative constant voltage is applied to said first plate electrode, while said second plate electrode and a third one of said plate electrodes are connected to ground;

an electron gun located outside said waveguiding structure, along said line, and located proximate said first plate electrode, said electron gun having a negative voltage with respect to said first electrode;

a microchannel plates of said electron multiplier having electron entrance surfaces oriented toward said electron gun, and electron exit surfaces oriented away from said gun;

a fast-rising pulse is applied to said electron gun, said pulse initiating a low-intensity pulsed electron beam from said gun, said electron beam accelerated toward said electron multiplier by said negative voltage and thereby attaining a resulting beam velocity, said electron beam having a substantially-flat front surface composed of electrons, said front surface being inclined at an angle of inclination with respect to said entrance surface of said first microchannel plate of said electron multiplier;

said electrons in said front surface of said electron beam first making contact with said entrance surface of said first microchannel plate of said electron multiplier at a narrow intersection region where said front surface of said beam and said entrance surface of said first plate converge;

said electrons in said front surface of said electron beam at said intersection region being promptly amplified nonlinearly by said two microchannel plates, said amplification comprising an immediate, complete discharge of said second plate in a narrow region of said second plate proximate said first intersection region and parallel to it;

said first intersection region moving along said entrance surface of said first microchannel plate toward said second end of said waveguiding structure at a velocity determined by said beam velocity and said angle of inclination, and said amplified electrons being accelerated toward said second plate electrode by said voltage on said second plate electrode, said electron thereby acting to create an intense sheet electron beam from said low-intensity, pulsed electron beam;

said sheet electron beam proceeding across said first gap and through said screen in said second plate electrode, and being inclined with respect to said screen, crossing said screen in a second intersection region, said second intersection region also travelling with said velocity of said first intersection region toward said second end of said waveguiding structure;

said sheet electron beam crossing a second one of said gaps before being absorbed at said third plate electrode;

said sheet electron beam generating two transverse-electromagnetic pulses in said second gap, said generation initiated where said sheet beam begins to cross said screen, and terminated where the last of said sheet beam is absorbed at said third electrode, after which said pulses travel respectively toward said ends of said waveguiding structure at the speed of light in vacuum.

11. A device as defined in claim 10, further including a fourth parallel-plate electrode in said waveguiding structure, said fourth electrode placed in sequence with said three plate electrodes and connected to ground, said fourth electrode together with said second electrode providing shielding for said third electrode.

12. A device as defined in claim 11, further including a fifth parallel-plate electrode in said waveguiding structure, said fifth electrode located between said second and said third electrodes and connected to ground, said fifth electrode having a screen-covered aperture in alignment with said apertures in said first and second electrodes, thereby permitting said sheet beam to pass through.

* * * * *

UNITED STATES PATENT AND TRADEMARK OFFICE

CERTIFICATE OF CORRECTION

PATENT NO. : 5,150,067

DATED : September 22, 1992

INVENTOR(S) : Michael R. McMillan

It is certified that error appears in the above-indentified patent and that said Letters Patent is hereby corrected as shown below:

Col. 12, lines 29-32, change the two sentences "By removing ... in FIG. 8." to -- With short electromagnetic pulses, TEM-mode conditions are ensured if the transverse dimensions of the waveguiding structure are sufficiently small. --.

Signed and Sealed this

Twenty-third Day of November, 1993

Attest:

BRUCE LEHMAN

*Attesting Officer*

*Commissioner of Patents and Trademarks*